United States Patent
Nahas et al.

(10) Patent No.: US 6,842,365 B1
(45) Date of Patent: Jan. 11, 2005

(54) WRITE DRIVER FOR A MAGNETORESISTIVE MEMORY

(75) Inventors: Joseph J. Nahas, Austin, TX (US); Thomas W. Andre, Austin, TX (US); Chitra K. Subramanian, Austin, TX (US); Halbert Lin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/656,676

(22) Filed: Sep. 5, 2003

(51) Int. Cl.[7] .................. G11C 11/00; G11C 11/14; G11C 11/15
(52) U.S. Cl. .................. 365/158; 365/171; 365/173
(58) Field of Search .................. 365/158, 171, 365/173

(56) References Cited

U.S. PATENT DOCUMENTS

| | | | | |
|---|---|---|---|---|
| 6,341,084 B2 | * | 1/2002 | Numata et al. | 365/171 |
| 6,343,032 B1 | * | 1/2002 | Black et al. | 365/158 |
| 6,504,752 B2 | * | 1/2003 | Ito | 365/158 |
| 6,522,575 B2 | * | 2/2003 | Inui | 365/158 |
| 6,531,723 B1 | | 3/2003 | Engel et al. | |
| 6,545,906 B1 | | 4/2003 | Savtchenko | |
| 6,574,137 B2 | * | 6/2003 | Voshell et al. | 365/171 |
| 6,680,862 B2 | * | 1/2004 | Hidaka | 365/158 |
| 6,693,824 B2 | * | 2/2004 | Nahas et al. | 365/158 |
| 6,693,882 B1 | | 2/2004 | Ito | |

* cited by examiner

Primary Examiner—Trong Phan
(74) Attorney, Agent, or Firm—James L. Clingan, Jr.; David G. Dolezal

(57) ABSTRACT

A write driver uses a reference current that is reflected to a driver circuit by a voltage. The driver circuit is sized in relation to the device that provides the voltage so that the current through the driver is a predetermined multiple of the reference current. This voltage is coupled to the driver circuit through a switch. The switch is controlled so that the driver circuit only receives the voltage when the write line is to have write current through it as determined by a decoder responsive to an address. The driver is affirmatively disabled when the write line is intended to not have current passing through it. As an enhancement to overcome ground bounce due to high currents, the input to the driver can be capacitively coupled to the ground terminal that experiences such bounce. Additional enhancements provide benefits in amplitude and edge rate control.

32 Claims, 3 Drawing Sheets

WRITE DRIVER FOR A MAGNETORESISTIVE MEMORY

RELATED APPLICATION

This application is related to:

U.S. patent application Ser. No. 10/656,646 entitled "Circuit For Write Field Disturbance Cancellation In An MRAM And Method Of Operation" by Nahas et al. filed Sep. 5, 2004, and assigned to the assignee hereof.

FIELD OF THE INVENTION

This invention relates to Magnetoresistive Random Access Memories (MRAMs), and more particularly to write drivers for use in MRAMs.

BACKGROUND OF THE INVENTION

Magnetoresistive memories (MRAMs) have certain beneficial, characteristics such as being non-volatile, dense, and fast. These characteristics have made it very attractive for use as both a general purpose memory and as an embedded memory, i.e., a memory on-board a logic circuit such as a microcomputer. Putting such MRAMs into production has been difficult due to a number of factors. One of these has been able to consistently write a one and a zero that can be identified as such.

One technique for overcoming this difficulty is the development of a toggle bit MRAM. Such is described in U.S. Pat. No. 6,545,906 B1, Savtchenko et al. In this case the MRAM is programmed by applying two timed magnetic signals so that the MRAM cell switches states regardless of its present state. A change from a logic one to a logic zero is achieved in the same way as a change from a logic zero to a logic one. This technique provides excellent consistency between the logic one state and the logic zero state. Because the toggling of logic states is achieved by controlling the magnetic field in a bit, it is current in the write lines that create magnetic fields that must be controlled.

Thus there is a need for write drivers for MRAMs that provide effective current control while also taking into account the normal desire of circuit design of small size. Thus a write driver that provides both small size and effective current control is desirable.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

A write driver uses a reference current that is reflected to a driver circuit by a voltage. The driver circuit is sized in relation to the device that provides the voltage so that the current through the driver is a predetermined multiple of the reference current. This voltage is coupled to the driver circuit through a switch. The switch is controlled so that the driver circuit only receives the voltage when the write line is to have write current through it as determined by a decoder responsive to an address. The driver is affirmatively disabled when the write line is intended to not have current passing through it. As an enhancement to overcome ground bounce due to high currents, the input to the driver can be capacitively coupled to the ground terminal that experiences such bounce. Additional enhancements provide benefits in control of the current amplitude and edge rate. This is better understood with reference to the drawings and the following description.

Figure 1:
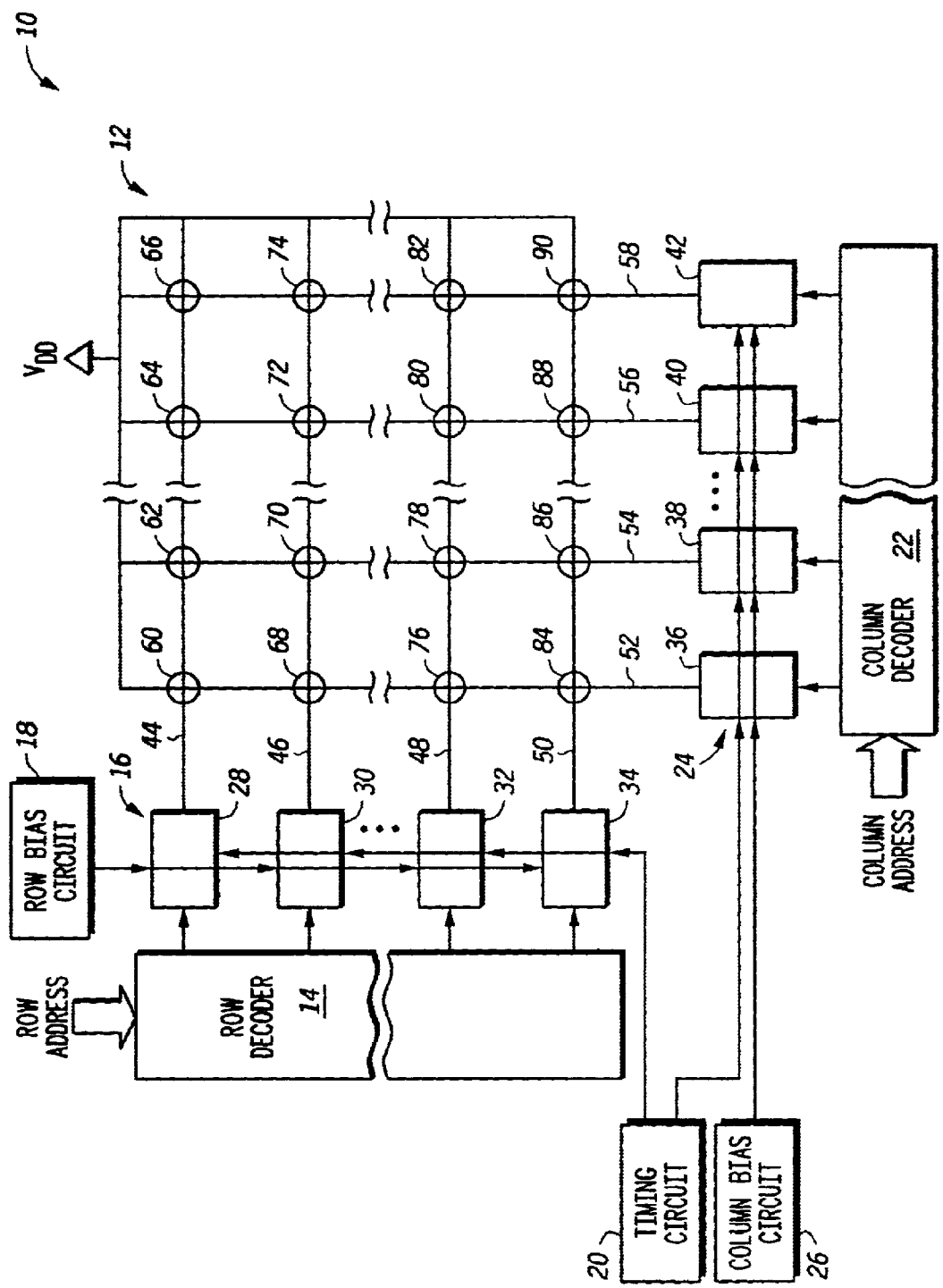
FIG. 1 is a block diagram of a memory according one embodiment of the invention.

Shown in FIG. 1 is a memory 10 having an array 12 of magnetoresistive memory (MRAM) cells, a row decoder 14 for receiving a row address, a plurality of row write drivers 16 coupled to row decoder 14, a row bias circuit 18 coupled to the row write drivers 16, a timing circuit 20 coupled to the row write drivers 16, a column decoder 22 for receiving a column address, a plurality of column write drivers 24 coupled to column decoder 22 and timing circuit 20, and a column bias circuit 26 coupled to the column write drivers 24. Array 12 comprises row write lines 44, 46,48, and 50, column write lines 52, 5 54,56, and 58, and MRAM cells 60, 62, 64, 66, 68, 70,72, 74,76,78, 80, 82, 84, 86, 88, and 90. Plurality of row write drivers 16 comprise row write driver 28, which is coupled to row write line 44, row write driver 30, which is coupled to row write line 46, row write driver 32, which is coupled to row write line 48, and row write driver 34, which is coupled to row write line 50. Plurality of column write drivers 24 comprise column write driver 36, which is coupled to column write line 52, column write driver 38, which is coupled to column write line 54, column write driver 40, which is coupled to column write line 56, and column write driver 42, which is coupled to column write line 58. One of ordinary skill in the art would understand that in practice, memory 10 would include many more memory cells as well as other features such as address buffers, word lines and bit lines for reading, sense amplifiers for reading, input buffers for receiving data to be written, and output buffers. Such a memory is described in U.S. patent application Ser. No. 10/185,888, titled "Memory Architecture with Write Circuitry and Method Therefor," filed Jun. 28, 2002.

In memory 10, memory cells 60–90 are MRAM cells that are written (programmed) by toggling. In this case a particular memory cell, such as memory cell 84 is written by overlapping write pulses. Whether the current is applied to column write 52 or row write line 50 first is somewhat arbitrary because the cell can be effectively written either way. Which of these is optimum may be more related to the amount of disturb on adjacent cells and other factors. Assuming in this case that current is applied in the row direction first, a current pulse will be applied to row write line 50 by row write driver 34 while no current is applied to column write line 52 by column write driver 36. This timing is controlled by timing circuit 20. The current magnitude is controlled by row bias circuit 18. While row write driver 34 is still applying the current pulse to row write line 50, a current pulse is applied to column write line 52 by column write driver 36. The magnitude of the current is of this current pulse is controlled by column bias circuit 26. While column write driver 36 is applying the current pulse to column write line 52, row write driver 34 terminates the current pulse applied to row write line 50. After the current pulse applied to row write line 50 has been terminated, the pulse applied to column write line 52 is terminated. This completes the toggling of the state of cell 84. The write drivers 34 and 24 have benefits that make them particularly well suited for this type of toggling.

Figure 2:
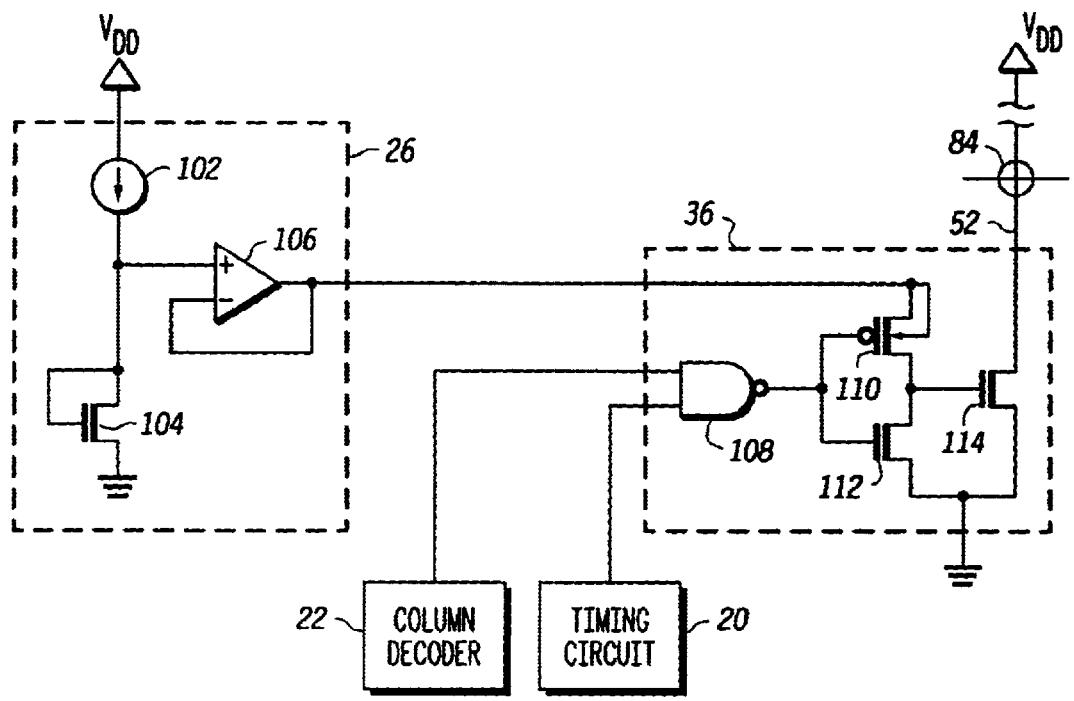
FIG. 2 is a combination block diagram and circuit diagram of a portion of the memory of FIG. 1 according to a first implementation.

Shown in FIG. 2 are memory cell 84, column write driver 36, column bias circuit 26, column decoder 22, and timing circuit 20. Bias circuit 26 and write driver 36 are shown as circuit diagrams. Bias circuit 26 comprises a current source 102, an N channel transistor 104, and a unity gain amplifier 106. Current source 102 has a first terminal coupled to a first positive power supply terminal and a second terminal. Current flows from the first terminal to the second terminal. Transistor 104 has a control electrode and a first current electrode (drain in this case) connected to the second terminal of the current source and a second current electrode coupled to a negative power supply terminal, in this case, ground.

Unity gain amplifier 106 has a first terminal connected to the second terminal of current source 102 and an output. This output of unity gain amplifier 106 is the output of bias circuit 26 and is coupled to the column write drivers, including write driver 36 as shown in FIG. 2. Unity gain amplifier 106 in this example is achieved by an operational amplifier in which the non-inverting input is connected to the second terminal of current source 102 and the inverting input is coupled to the output of the operational amplifier. Transistor 104, in the well-understood current mirror configuration, establishes a bias voltage useful for establishing a current through another transistor that is directly proportional to the current through transistor 104. The ratio of the currents is well understood to be based on the ratio of the size of transistor 104 to that of the other transistor that receives the bias voltage. This bias voltage is buffered by unity gain amplifier 106 because it is received by many other write drivers. The number of column write drivers is generally going to be relatively large, for example 1024 in the present case.

Write driver 36 comprises a NAND gate 108, a P channel transistor 110, an N channel transistor 112, and an N channel transistor 114. NAND gate 108 has a first input coupled to the output of column decoder 22, a second input coupled to a first output of timing circuit 20, and an output. Transistor 110 has a gate (control electrode) coupled to the output of NAND gate 108, a source coupled to the output of unity gain amplifier 106, and a drain. The body and source of transistor 10 are tied together. Transistor 112 has a gate coupled to the output of NAND gate 112, a drain coupled to the drain of transistor 110, and source connected to the negative power supply terminal. Transistor 114 has a control electrode connected to the drains of transistors 110 and 112, a drain connected to column write line 52, and a source connected to the negative power supply terminal. Transistor 114 is significantly larger than transistor 104. The channel lengths are preferably the same with the channel width of transistor 114 being significantly larger than that of transistor 104. This ratio is preferably in the order of 100.

In operation, when column write line 52 is selected, column decoder 22 outputs a logic high to NAND gate 108. Timing circuit 20 provides a positive going pulse at the time current is to be supplied through column write line 52. The application of the logic high by the pulse from timing circuit 20 causes NAND gate 108 to output a logic low that causes transistor 110 to become conductive. Transistor 110 thereby operates as a switch that couples the output of unity gain amplifier 106 to the gate of transistor 114. Transistor 114 becomes conductive with a gate voltage that controls the current through transistor 114. The current is controlled in the familiar current mirror fashion in which the current through transistor 104 is reflected to transistor 114 via unity gain amplifier 106 and transistor 110. The ratio of widths of transistors 104 and 114 is set to obtain the desired current through column write line 52. The current supplied by current source 102 is carefully controlled and known. The width ratios are then selected to achieve the desired current through column write line 52 for the generation of the desired magnetic field for writing the MRAM cells.

When it is time to terminate the current through write line 52, timing circuit 20 terminates the pulse so that NAND gate 108 switches its output to a logic high causing transistor 112 to be conductive and transistor 10 to be non-conductive. With transistor 112 conductive, the gate of transistor 114 is coupled to its source causing it be non-conductive and thereby terminating the write current through write line 52. Thus, in this operation, the only transistor that has to pass the large write current is transistor 114. This transistor 114, due to the large current it must carry, is far larger than all of the other transistors combined that comprise write driver 36. Any additional transistor in the current path of write line 52 would also have to be of comparable size and thus greatly increase the area of the write drivers. Thus, there is provided a controlled current through write line 52 and thereby cells 84, 76, 68, and 60 that are connected to write line 52 while only having to have one transistor that is very large.

Column decoder 22 provides a logic low output to all of the column write drivers that are deselected. Thus the signal from column decoder 22 that is associated with write bit line 52 is brought to a logic low when write bit line 52 is deselected. This keeps the output of NAND gate 108 at a logic high, which causes transistor 112 to be conductive and transistor 110 to be non-conductive. In that condition, transistor 114 has its gate coupled to its source and is thereby non-conductive.

The current passing through a write line such as write line 52 can become large enough to actually raise the voltage on the source of transistor 114. If, for example, the ground return has a 10 ohm resistance and the write current is in the order of 10 milliamperes, the source of transistor 114 could be raised 100 millivolts. A 100 millivolt reduction in gate to source voltage on transistor 114 could significantly reduce the current through transistor 114 and thus through write line 52. This type of problem is a common problem in a variety of circuits and is commonly known as ground bounce.

Figure 3:
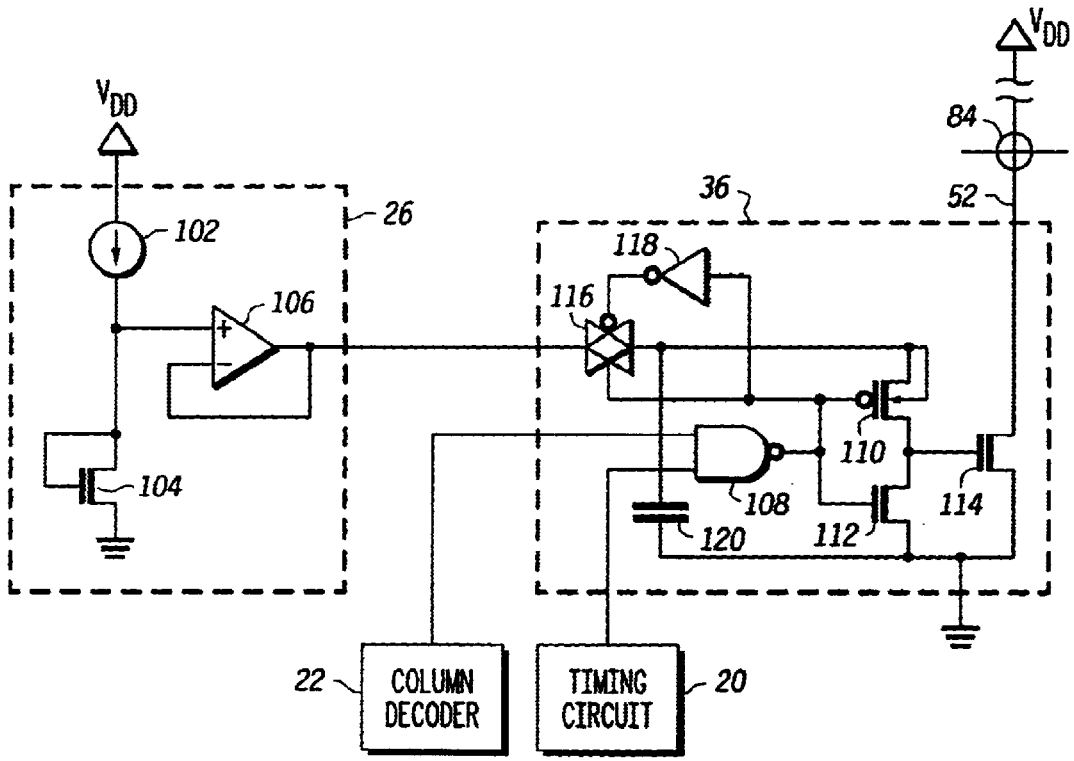
FIG. 3 is a combination block diagram and circuit diagram of the portion of the memory of FIG. 1 according to a second implementation.

Shown in FIG. 3 is an alteration to the write driver shown in FIG. 2 that addresses this potential problem. Write driver 36 of FIG. 1 then is implemented differently than as shown in FIG. 2. This implementation of write driver 36 of FIG. 3 has the additional elements of a transmission gate 116, an inverter 118, and a capacitor 120. Transmission gate 116 is interposed between the output of bias circuit 26 and the source of transistor 10. The result is that a first signal terminal of transmission gate 116 is connected to the output of bias circuit 26 and a second signal terminal coupled to the source of transistor 110. The inverting control input is coupled to the output of inverter 118 and the non-inverting control input is coupled to the output of NAND gate 108. The input of inverter 118 is coupled to the output of NAND gate 108. Capacitor 120 has a first terminal connected to the source of transistor 114 and a second terminal connected to the source of transistor 110.

For the case when write line 52 is selected but timing circuit 20 has not yet generated the write pulse, NAND gate is providing a logic high output so that transmission gate 116 is conductive, transistor 110 is non-conductive, and transistor 112 is conductive. The result is that transistor 114 is non-conductive and capacitor 120 is charged to the voltage supplied by the output of bias circuit 26. When timing circuit 20 generates the write pulse, NAND gate 108 outputs a logic low which causes transistor 112 to be nonconductive, transistor 110 to be conductive, and transmission gate 116 to be non-conductive. In this condition transistor 114 becomes conductive so that write current flows through write line 52. As this write current flows, then, due to ground bounce, the source voltage of transistor 114 may rise. In such case, due to capacitor 120, the voltage on the source of transistor 110 will rise by the same amount. This voltage on the source of transistor 110 continues to be coupled to the gate of transistor 114. Thus the increase in source voltage does not result in a decrease in gate to source voltage so that the current through write line 52 remains relatively constant. The termination of the write current is achieved in the same way as for the circuit of FIG. 2. The timing circuit terminates the pulse so that NAND gate 108 provides a logic high output causing transistor 112 to be conductive, transistor 110 to be non-conductive, and transmission gate 116 to be conductive. These conditions keep capacitor 120 charged to the voltage of the output of bias circuit 26 is and cause transistor 114 to be non-conductive. The column decoder, when deselecting write line 52, provides a logic low output keeping the output of NAND gate 108 in the logic high condition and thereby keeping the conditions as described when the timing circuit terminates the write current.

Figure 4:
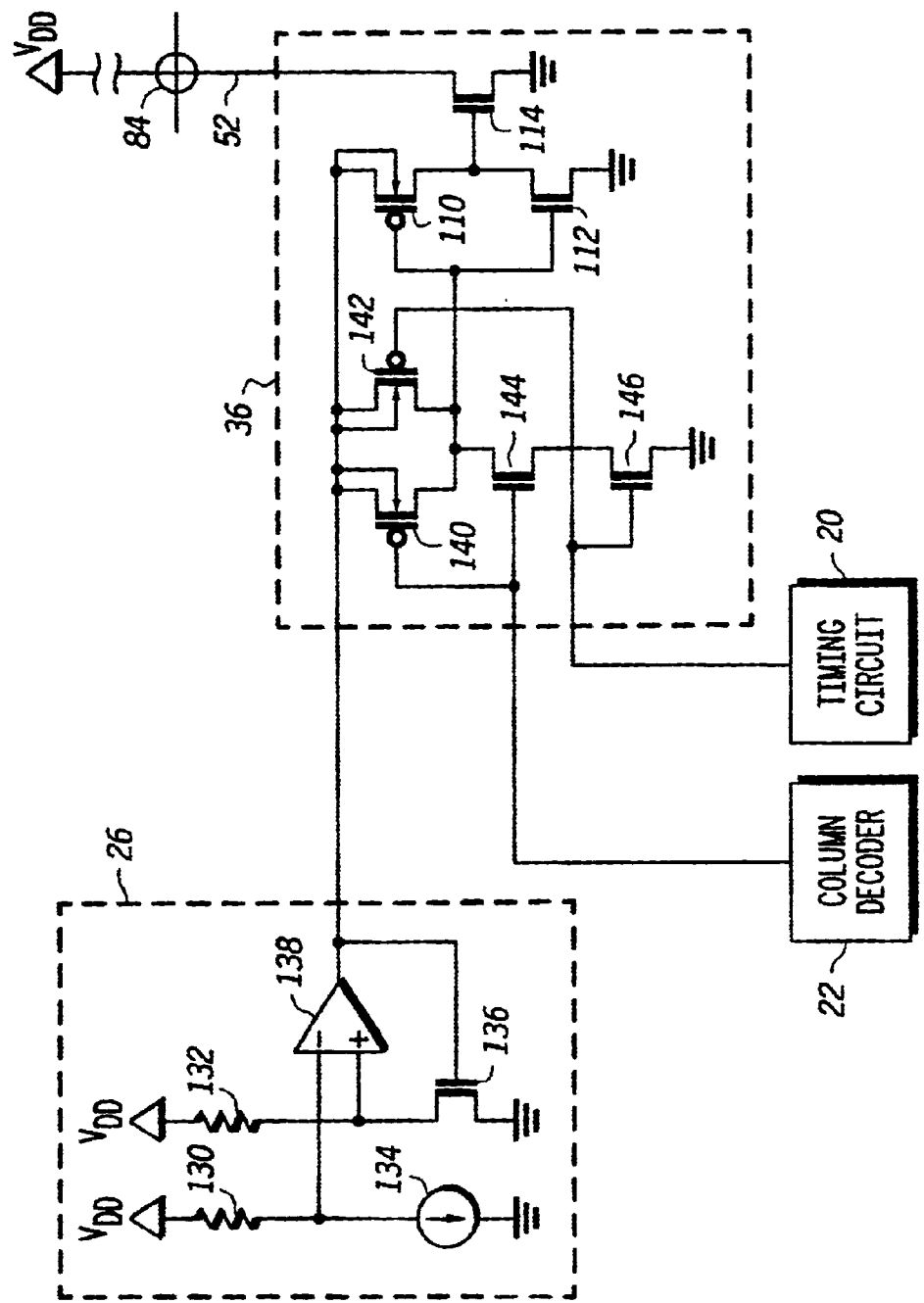
FIG. 4 is combination block diagram and circuit diagram of the portion of the memory of FIG. 1 according to a third implementation.

An alternative for column bias circuit 26 and another alternative for column write driver 36 are shown in FIG. 4 that provide increased control of the amplitude and edge rate, over a range of operating conditions, for the current pulse applied to write line 52. In this embodiment column bias circuit comprises a resistor 130, a resistor 132, current source 134, N channel transistor 136, and operational amplifier 138. Resistor 130 has a first terminal coupled to VDD and a second terminal. Current source 134 has a first terminal coupled to the second terminal of resistor 130 and a second terminal coupled to ground. Resistor 132 has a first terminal coupled to VDD and a second terminal. Transistor 136 has a drain coupled to the second terminal of resistor 132, a source coupled to ground, and a gate. Operational amplifier 138 has an inverting input coupled to the second terminal of resistor 130, a non-inverting input coupled to the second terminal of resistor 132, and an output coupled to the gate of transistor 136. Resistors 130 and 132 are designed to be predetermined multiples of the resistance of write line 52. This is preferably achieved using lines, which are connected in series, made in the same manner as write line 52.

Current source 134 draws a current through resistor 130 that results in a voltage applied to the non-inverting input of operational amplifier 138 that is the same as the voltage needed at the drain of transistor 114 to achieve the desired current through write line 52 when writing is occurring at write line 52. Operational amplifier 138 controls the gate of transistor 136 to draw current through resistor 132 to result in a voltage at the inverting input of operational amplifier 138 that is essentially equal to the voltage applied at the non-inverting input of operational amplifier 138. Thus, the voltage at the drain of transistor 136 is the voltage that is desired at the drain of transistor 114 for the write condition. Resistor 132 is a known multiple of the resistance of write line 52. Transistor 136 is chosen so that the channel width of transistor 114 has this same multiple relative to the channel width of transistor 136. Thus, the gate of transistor 136 is effectively biased at the voltage that, if applied to the gate of transistor 114, would cause transistor 114 to draw the desired write current through write line 52. Thus the gate voltage of transistor 136, which is the output of operational amplifier 138, is applied to the gate of transistor 114 through the control of column write driver 36.

A benefit of this approach is that it does not rely on just matching gate voltages, which is effect when the transistors are known to be in saturation, but also matches drain voltages. Thus, transistors 136 and 114 do not have to be in saturation to achieve the desired control of the write current. By not requiring that transistor 114 not be in saturation, the drain voltage can be lower and thus a given transistor can pull more current. Thus, for a given transistor size the write lines can be longer.

The other alternative for column write driver 36 shown in FIG. 4 is a different implementation of NAND gate 108 of FIG. 2. In particular, the different NAND gate comprises P channel transistors 140 and 142 and N channel transistors 144 and 146 that function as a NAND gate in providing the same logical function as NAND gate 108 of FIG. 2, but with an output that causes the driver, transistors 110 and 112, to transistor 114 to have a balanced rise and fall time. Transistor 140 has a source coupled to the output of operational amplifier 138, a gate coupled to the output of column decoder 22, and a drain coupled to the gate of transistor 110. Transistor 142 has a source coupled to the output of operational amplifier 138, a gate coupled to the output of timing circuit 20, and a drain coupled to the gate of transistor 110. Transistor 144 has a drain coupled to the gate of transistor 110, a gate coupled to the output of column decoder 22, and a source. Transistor 146 has a drain coupled to the source of transistor 144, a gate coupled to the output of timing circuit 20, and a source coupled to ground. The bodies of transistors 140 and 142 are tied to the sources of these transistors.

In operation and for the case in which write line 52 is switching from deselected to selected, column decoder 22 switches from a logic low to a logic high followed by timing circuit 20 also switching from a logic low to a logic high. Prior to this switching, the output of operational amplifier 138 is coupled to the gates of transistors 110 and 112. In this condition, transistor 114 is non-conductive. Upon the switching of the outputs of column decoder 22 and timing circuit 20, transistors 140 and 142 become non-conductive and transistors 144 and 146 become conductive causing ground potential to be applied to the gate of transistor 110 and 112. Thus the gate to source voltage of transistor 110 is switched from zero volts to a voltage that is equal in magnitude to the output of operational amplifier 138. Transistor 114 becomes conductive in response to transistor 110 becoming conductive. The rise time of the current drawn by transistor 114 is dependent on the rise time of the voltage applied by transistor 110 which in turn is dependent on the gate to source voltage applied to transistor 110.

After the write time has expired, timing circuit 20 switches to a logic low, causing transistor 142 to become conductive and transistor 146 to become non-conductive. This has the effect of applying the voltage of the output of operational amplifier 138 to the gates of transistors 110 and 112, thereby causing transistor 114 to become non-conductive. The fall time of the current drawn by transistor 114 is dependent on the fall time of the voltage applied by transistor 112 which in turn is dependent on the gate to source voltage applied to transistor 112. This gate to source voltage is equal to the voltage of the output of operational amplifier 138. Thus, the rise time and fall time of the current drawn by transistor 114 both are controlled by the same gate to source voltage, which is the voltage of the output of operational amplifier 138. Edge rate control is important for stable magnetic switching properties.

Column write driver 36 is exemplary of the other write drivers also. Column write bias circuit 26 is also exemplary of the row bias circuit. The output voltage provided by the row output bias circuit may or may not be the same as for the column bias circuit. This is an implementation issued based on the particular cell type and architecture chosen and may be dependent on the process for making the MRAM cells as well.

Various changes and modifications to the embodiments herein chosen for purposes of illustration will readily occur to those skilled in the art. For example, although a toggle programming MRAM is discussed for some applications, it should be apparent that other types of memory cells may utilize the features disclosed herein. Variations in the types of conductivities of transistors, the types of transistors, etc. may be readily made. For example, transistor 114 may be a P channel transistor that would further have the effect of requiring a reversal in the logic states of the other circuitry in the write driver. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

What is claimed is:

1. A memory comprising:
   a plurality of memory cells;
   a write line for writing a data value in the plurality of cells,
   a transistor coupled to the write line for controlling current in the write line, the transistor having a control electrode; and
   a first switch circuit having a first terminal coupled to the control electrode of the transistor and a second terminal coupled to a reference voltage circuit for providing a reference voltage for controlling an amount of current flowing through the write line during a write operation or memory, wherein the first switch circuit has a conductive state responsive to at least one of a timing signal or an enable signal.

2. The memory of claim 1 wherein the conductive state of the first switch circuit is responsive to both the timing signal and the enable signal.

3. The memory of claim 1 further comprising:
   a second switch circuit having a first terminal coupled to the control electrode and a second terminal coupled to a voltage source having a voltage level such that when the second switch circuit is in a conductive state, the transistor is non conductive, wherein the second switch circuit has a conductive state responsive to at least one of the timing signal or the enable signal.

4. The memory of claim 3 wherein when the first switch circuit is conductive, the second switch circuit is non conductive, and wherein when the first switch circuit is non conductive the second switch circuit is conductive.

5. The memory of claim 1 wherein:
   the reference voltage circuit includes a current source and a diode connected transistor coupled in series to the current source.

6. The memory of claim 5 wherein the reference voltage circuit further comprises a buffer circuit coupled to the second terminal.

7. The memory of claim 1 wherein the transistor includes a first current terminal connected to the write line and a second current terminal connected to a voltage source.

8. The memory of claim 1 wherein when the transistor is enabled for conducting a write current, the transistor operates in a saturation mode.

9. The memory of claim 1 wherein the write line provides current to the plurality of memory cells to create a magnetic field for writing a data value to the plurality of memory cells.

10. The memory of claim 1 wherein the transistor has a first current electrode coupled to the write line and a second current electrode coupled to a voltage source, the memory further comprising:
    a capacitor having a first electrode coupled to the second current electrode of the transistor and a second electrode coupled to the second terminal of the first switch circuit;
    a second switch circuit coupled between the second terminal of the switch circuit and the voltage reference circuit, the second switch circuit has a conductive state responsive to at least one of the timing signal or the enable signal.

11. The memory of claim 1 wherein the reference voltage circuit comprises:
    a reference transistor having a source coupled to a first power supply terminal, a gate, and a drain;
    a reference resistance having a first terminal coupled to a second power supply terminal, and a second terminal coupled to the drain of the reference transistor;
    an amplifier have a first input for receiving a bias voltage, a second input coupled to the drain of the reference transistor, and an output coupled to the gate of the reference transistor, wherein the output provides the reference voltage.

12. The memory of claim 11 further comprising:
    a current source having a first terminal coupled to the first power supply terminal, and a second terminal providing the bias voltage; and
    a resistor having a first terminal coupled to the second terminal of the current source and a second terminal coupled to the second power supply terminal.

13. The memory of claim 1, further comprising:
    a second switch circuit having a first terminal coupled to the control electrode and a second terminal coupled to the reference voltage circuit such that when the second switch circuit is in a conductive state, the transistor is non conductive, wherein the second switch circuit has a conductive state responsive to at least one of the timing signal or the enable signal.

14. A memory comprising:
    a plurality of memory cells;
    a plurality of write lines, each write line for writing a data value to a group of memory cells of the plurality of memory cells;
    a plurality of transistors, each transistor of the plurality of transistors coupled to a write line of the plurality of write lines for controlling a current of the write line;
    a plurality of switch circuits, each switch circuit having a first terminal coupled to a control electrode of a transistor of the plurality of transistors, each switch circuit including a second terminal coupled to a reference voltage circuit for providing a reference voltage for controlling an amount of the current flowing through a write line, wherein each switch circuit has a conductive state responsive to at least one of a timing signal or an enable signal of a plurality of enable signals.

15. The memory of claim 14 wherein:
    each enable signal of the plurality of enable signals is associated with a transistor of the plurality of transistors; and each switch circuit of the plurality of switch circuits has a conductive state responsive to at least the enable signal that is associated with the transistor of the plurality of transistors that has a control electrode coupled to the first terminal of the switch circuit.

16. The memory of claim 14 wherein each switch circuit of the plurality of switch circuit has a conductive state responsive to both the timing signal and the one of the plurality of enable signals.

17. The memory of claim 14 wherein:
the plurality of memory cells is managed in rows and columns;
each write line is for writing a data value to a column of memory cells of the plurality of memory cells;
the memory further comprises:
a second plurality of write lines, each write line of the second plurality for writing a data value to a row of memory cells of the plurality of memory cells;
a second plurality of transistors, each transistor of the second plurality is coupled to a write line of the second plurality of write lines for controlling current of the write line;
a second plurality of switch circuits, each switch circuit of the second plurality having a first terminal coupled to a control electrode of a transistor of the second plurality of transistors, each switch circuit of the second plurality has a second terminal coupled to a second reference voltage circuit for providing a reference voltage for controlling an amount of current flowing through a write line of the second plurality of write lines, wherein each switch circuit of the second plurality of switch circuits has a conductive state responsive to at least one of a second timing signal or an enable signal of a second plurality of enable signals.

18. The memory of claim 17 wherein for each memory cell of the plurality, a write line of the first plurality and a write line of the second plurality each provide current to the memory cell to create a magnetic field for writing a data value to the memory cell.

19. The memory of claim 14 wherein each transistor of the plurality of transistors has a first current electrode coupled to the write line of the plurality of write lines and a second current electrode coupled to a voltage source, the memory further comprising:
a plurality of capacitors, each capacitor having a first electrode coupled to the second current electrode of a transistor of the plurality of transistors and a second electrode coupled to a second terminal of a switch circuit of the plurality of switch circuits;
a plurality of second switch circuits, each switch circuit of the second plurality of switch circuits is coupled between a second terminal of a switch circuit of the plurality and the voltage reference circuit, each switch circuit of the second plurality has a conductive state responsive to at least one of a timing signal or an enable signal of the plurality of enable signals.

20. The memory of claim 14 wherein:
the reference voltage circuit includes a current source and a diode connected transistor coupled in series to the current source.

21. The memory of claim 20 wherein for each transistor of the plurality of transistors, the reference voltage circuit acts as a first stage of a current mirror and the transistor acts as the second stage of a current mirror when a switch circuit of a plurality of switch circuits having a first terminal coupled to the control electrode of the transistor is in a conductive state.

22. The memory of claim 20 wherein the reference voltage circuit further comprises a buffer circuit having an output coupled to the first terminal of each switch circuit of the plurality of switch circuits.

23. The memory of claim 14 wherein each transistor of the plurality of transistors includes a first current terminal connected to a write line of the plurality and a second current terminal connected to a voltage source.

24. The memory of claim 14 wherein for each transistor of the plurality, when the transistor is enabled for conducting a write current, the transistor operates in a saturation mode.

25. The memory of claim 14 wherein the reference voltage circuit comprises:
bias means for providing bias voltage representative of a desired voltage applied across the write lines;
a reference transistor having a gate and a drain; and
reference means, coupled to the transistor and the bias means, for providing the reference voltage by determining a gate voltage applied to the gate of the reference transistor that provides the desired voltage on the drain of the reference transistor.

26. A memory comprising:
a plurality of memory cells;
a write line for writing a data value in the plurality of cells;
a transistor coupled to the write line for controlling current in the write line, the transistor having a control electrode;
means for providing a control signal to the control electrode of the transistor, wherein when the control signal is not asserted, no current flows through the transistor, and when the control signal is asserted, the control signal has a voltage that controls an amount of current flowing through the transistor.

27. The memory of claim 26 wherein the means is responsive to assert the control signal in response to at least one of a timing signal or an enable signal.

28. The memory of claim 26 wherein the means is responsive to assert the control signal in response to both the timing signal and the enable signal.

29. The memory of claim 26 wherein the write line provides current to the plurality of memory cells to create a magnetic field for writing a data value to the plurality of memory cells.

30. A memory comprising:
a plurality of memory cells;
a plurality of write lines, each write line for writing a data value to a group of cells of the plurality of memory cells;
a plurality of transistors, each transistor of the plurality of transistors coupled to a write line of the plurality for controlling a current of the write line;
for each transistor of the plurality of transistors, means for providing a control signal to the control electrode of the transistor, wherein when the control signal is not asserted, no current flows through the transistor, and when the control signal is asserted, the control signal has a voltage that controls an amount of current flowing through the transistor.

31. The memory of claim 30 wherein for each transistor of the plurality of transistors, the means is responsive to assert the control signal in response to at least one of a timing signal or an enable signal of a plurality of enable signals.

32. The memory of claim 30 wherein for each transistor of the plurality, the means is responsive to assert the control signal in response to both the timing signal and the enable signal of the plurality of enable signals.

* * * * *